(12) United States Patent
Plavec et al.

(10) Patent No.: US 9,881,692 B2
(45) Date of Patent: Jan. 30, 2018

(54) ELECTRONIC MEMORY DEVICE AND TEST METHOD OF SUCH A DEVICE

(71) Applicant: EM Microelectronic-Marin SA, Marin (CH)

(72) Inventors: Lubomir Plavec, Brno (CZ); Filippo Marinelli, Lussy-sur-Morges (CH); Miloslav Kubar, Prague (CH)

(73) Assignee: EM Microelectronic-Marin SA, Marin (CH)

( * ) Notice: Subject to any disclaimer, the term of this patent is extended or adjusted under 35 U.S.C. 154(b) by 0 days.

(21) Appl. No.: 14/930,785

(22) Filed: Nov. 3, 2015

(65) Prior Publication Data
US 2016/0141052 A1  May 19, 2016

(30) Foreign Application Priority Data

Nov. 17, 2014  (EP) ..................................... 14193480

(51) Int. Cl.
*G11C 29/08* (2006.01)
*G11C 7/12* (2006.01)
(Continued)

(52) U.S. Cl.
CPC ................ *G11C 29/08* (2013.01); *G11C 7/12* (2013.01); *G11C 7/22* (2013.01); *G11C 8/10* (2013.01);
(Continued)

(58) Field of Classification Search
CPC ......... G11C 29/08; G11C 29/18; G11C 29/34; G11C 7/12; G11C 7/22; G11C 8/10; G11C 2029/10; G11C 2029/1202
See application file for complete search history.

(56) References Cited

U.S. PATENT DOCUMENTS

| 5,086,413 A | * | 2/1992 | Tsuboi | G11C 29/34 |
| | | | | 365/185.12 |
| 5,233,614 A | * | 8/1993 | Singh | G06F 11/1044 |
| | | | | 714/702 |

(Continued)

FOREIGN PATENT DOCUMENTS

| WO | WO 2014/123064 A1 | 8/2014 | |
| WO | WO 2014123064 A1 | * 8/2014 | ............. G11C 29/12 |

OTHER PUBLICATIONS

European Search Report dated Feb. 17, 2015 with written opinion in European Application 14193480.2, filed Nov. 17, 2014.

*Primary Examiner* — Vu Le
*Assistant Examiner* — Sung Cho
(74) *Attorney, Agent, or Firm* — Oblon, McClelland, Maier & Neustadt, L.L.P.

(57) ABSTRACT

The electronic memory device comprises a non-volatile memory matrix organized in rows and columns, an address decoder with address input lines for selecting a row according to a particular address given on the address input lines. Additional address mask input lines are provided, each address mask input line being assigned to an address input line, wherein an address mask input line in activated state has the effect of ignoring the assigned address input line. The method for testing said electronic memory device is performed with a significant lower number of read/write operations, since by ignoring a particular address line a plurality of write operations can be performed simultaneously.

11 Claims, 3 Drawing Sheets

(51) Int. Cl.
- *G11C 29/18* (2006.01)
- *G11C 29/34* (2006.01)
- *G11C 7/22* (2006.01)
- *G11C 8/10* (2006.01)
- *G11C 29/12* (2006.01)
- *G11C 29/26* (2006.01)

(52) U.S. Cl.
CPC ............ *G11C 29/18* (2013.01); *G11C 29/34* (2013.01); *G11C 2029/1202* (2013.01); *G11C 2029/2602* (2013.01)

(56) References Cited

U.S. PATENT DOCUMENTS

| | | | | |
|---|---|---|---|---|
| 5,289,429 | A * | 2/1994 | Watanabe | G11C 8/12 365/230.03 |
| 5,297,096 | A * | 3/1994 | Terada | G11C 16/14 365/185.06 |
| 5,577,221 | A * | 11/1996 | Liu | G06F 12/0623 711/100 |
| 5,619,460 | A * | 4/1997 | Kirihata | G11C 29/10 365/189.07 |
| 6,047,352 | A * | 4/2000 | Lakhani | G11C 7/1045 365/185.11 |
| 6,768,685 | B1 | 7/2004 | Scheuerlein | |
| 2004/0233703 | A1 | 11/2004 | Jeong et al. | |
| 2006/0018167 | A1* | 1/2006 | Jeong | G11C 8/12 365/201 |
| 2006/0140014 | A1 | 6/2006 | Hsieh et al. | |
| 2008/0298148 | A1 | 12/2008 | Nagata | |
| 2014/0301132 | A1* | 10/2014 | Adachi | G11C 13/0035 365/148 |

* cited by examiner

ELECTRONIC MEMORY DEVICE AND TEST METHOD OF SUCH A DEVICE

This application claims priority from European Patent Application No. EP14193480.2 filed Nov. 17, 2014, the entire disclosure of which is hereby incorporated herein by reference.

TECHNICAL FIELD

The present invention relates to a test method of an electronic memory device, which includes a non-volatile memory matrix organized in rows and columns with memory cells, a row address decoder, column driver unit for erasing or writing memory words on the rows, and an allocated read unit.

The present invention further relates to the electronic memory device for implementing said test method.

BACKGROUND OF THE INVENTION

A non-volatile memory typically contains address decoders selecting appropriate row and column of the memory matrix for a given input address. Said memory matrix is composed of cells arranged in rows and columns. The address decoder and the memory matrix have to be checked during the production test of the chip to be sure it is fabricated correctly. There can be several kinds of defects on the address decoder or the memory matrix like shorts (=short circuits) between different lines, floating inputs/outputs. The goal of the production test is to check the chips and rejecting defective chips. A typical example of a non-volatile memory is an EEPROM.

The test of the electronic memory device with the address decoder can be done by several ways. The most conservative approach is to write a dedicated pattern into the memory. The pattern needs to have a unique content on each row and column. The pattern is checked by the read operation after the write operation. A typical example of such pattern is shown in the following table, which shows a memory matrix or array with 8 rows or lines and 8 columns:

| | column | | | | | | | |
|---|---|---|---|---|---|---|---|---|
| row | 7 | 6 | 5 | 4 | 3 | 2 | 1 | 0 |
| 0 | 1 | 0 | 0 | 0 | 0 | 0 | 0 | 0 |
| 1 | 0 | 1 | 0 | 0 | 0 | 0 | 0 | 0 |
| 2 | 0 | 0 | 1 | 0 | 0 | 0 | 0 | 0 |
| 3 | 0 | 0 | 0 | 1 | 0 | 0 | 0 | 0 |
| 4 | 0 | 0 | 0 | 0 | 1 | 0 | 0 | 0 |
| 5 | 0 | 0 | 0 | 0 | 0 | 1 | 0 | 0 |
| 6 | 0 | 0 | 0 | 0 | 0 | 0 | 1 | 0 |
| 7 | 0 | 0 | 0 | 0 | 0 | 0 | 0 | 1 |

The writing of a test pattern according to above-mentioned table into a non-volatile memory is a quite time consuming operation since the writing of one word into the EEPROM memory typically takes several ms time. This became to be highly critical especially for large EEPROMs. If there are e.g. 1024 rows with 2 ms write time per row, this write operation will take more than 2 s; 1024 rows correspond to an address bus width of 10 address lines: $2^{10}=1024$. These 2 s are a significant portion of the test time of the chip and has a direct impact to the chip price due to a time consuming memory test.

There are several approaches which try to completely get rid off the write operations and reducing the test time due to this.

One of the approaches uses a ROM at the end of the EEPROM memory array with a unique content in each row of the ROM. The reading of such ROM allows testing the decoding of the rows. This approach has also some drawbacks. The additional area is needed for the implementation of the ROM and the capability to check the high impedance shorts is limited since the complete test is done without using high voltage HV. The so called <<high voltage>> is used for erasing/writing of an element as a byte with 8 bits or word with 16 bits of the EEPROM. In this context, the following technical terms are used in this paper:

Cell of a memory contains one bit.

The content of a row or a line contains one or more words.

The term word or words contains m cells respectively m bits for one or more words.

The U.S. Pat. No. 5,086,413 A describes the implementation of the circuit which allows to write all odd or even rows at the time (by one write operation). This allows to check the shorts (=short circuits) in the memory array and also shorts between the neighboring outputs of the row decoder.

The patent application US 2006/018167 A1 describes a usage of a similar structure for stress test of flash memory columns. It has to be noted, that the term <<EEPROM>> is commonly used for devices with a per-word erase capability and <<flash>> for devices which only support large-block erasure.

Figure 1A:
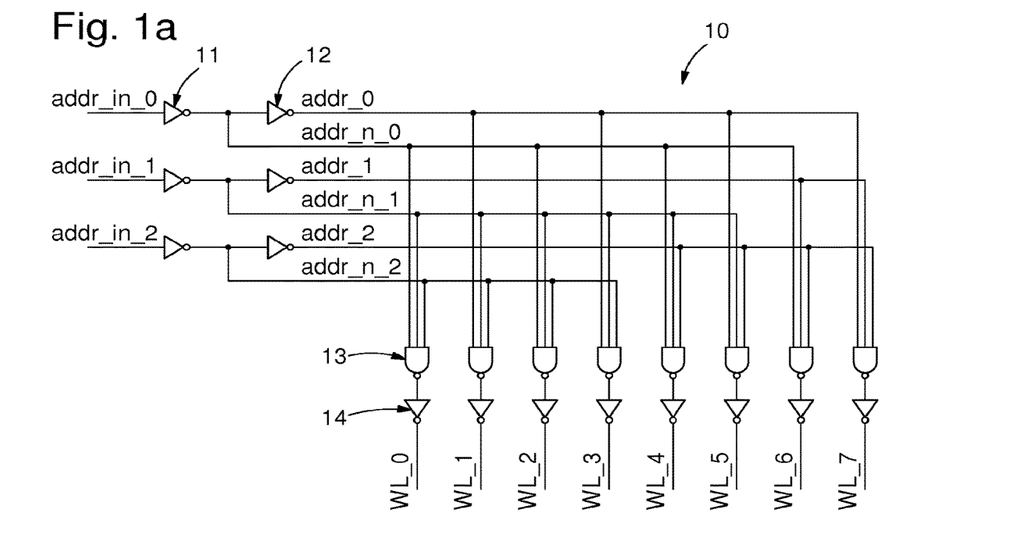
FIGS. 1a and 1b already cited show two embodiments of a typical scheme of an address decoder circuit according to the state of the art.
Figure 1B:
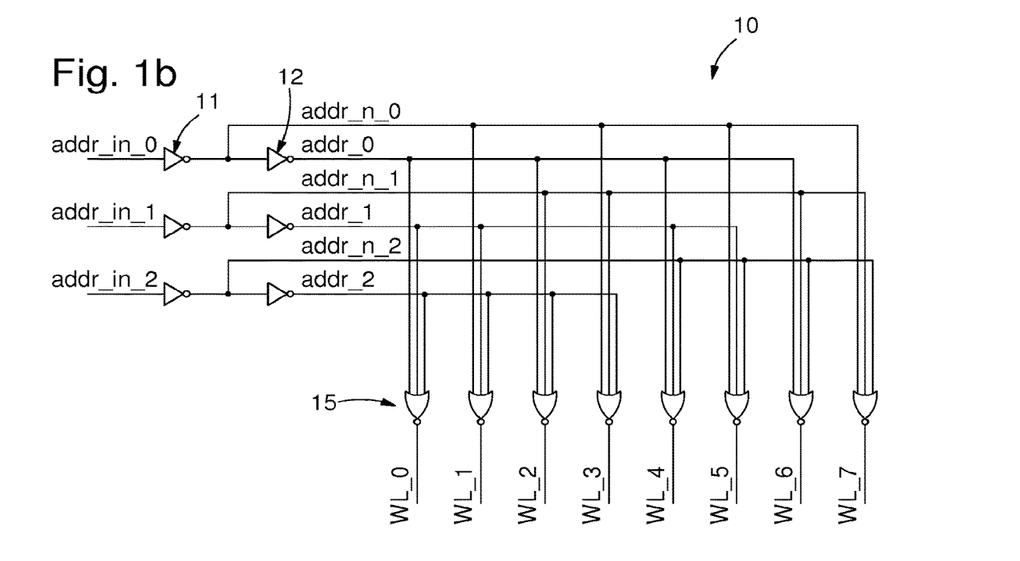

Reference is made to FIGS. 1a and 1b showing two embodiments of an address decoder 10 with address input lines according to the state of the art. In this case, it is shown three address input lines for addressing 8 rows WL_0, WL_1, WL_2, WL_3, WL_4, WL_5, WL_6, WL_7 of the memory matrix. So the address decoder as depicted in FIGS. 1a and 1b typically uses the address inputs addr_in_0, addr_in_1, addr_in_2 for an address bus of 3 bits in this case to select one of the 8 rows or lines.

From these address inputs addr_in_0, addr_in_1, addr_in_2, there are three inverters 11 to provide three inverted addresses addr_n_0, addr_n_1, addr_n_2. Three second inverters 12 receiving the inverted addresses addr_n_0, addr_n_1, addr_n_2 provide three addresses addr_0, addr_1, addr_2 corresponding to the state of address inputs addr_in_0, addr_in_1, addr_in_2. The six lines addr_x and their inversion addr_n_x are used and combined per three through NAND gates 13 followed by third inverters 14 for selecting particular row(s) of the memory array in the first embodiment of FIG. 1a. For the second embodiment of FIG. 1b, the six lines addr_x and their inversion addr_n_x are used and combined per three through NOR gates 15 for selecting particular rows of the memory array.

It is to be noted by reference to FIGS. 1a and 1b that, if both addr_x and addr_n_x, for example with addr_0 and addr_n_0, are forced to '1', this address bit will be ignored and doing so two words are selected at the same time. If this is done consecutively for all the bits a write even/odd feature can be performed. That is a problem to be checked in a production test method.

SUMMARY OF THE INVENTION

Therefore it is the aim of the present invention to provide an electronic memory device and a test method of such a device which significantly reduce the required time for performing a test of the electronic non-volatile memory device.

This aim is reached by a test method of an electronic memory device and by the electronic memory device for implementing the method with the features in the independent claims.

An electronic memory device according to the invention comprises:
a non-volatile memory matrix organized in rows and columns, the memory matrix having memory cells wherein
the cells of one row are forming one or more memory words;
an address decoder with address input lines for selecting a row according to a particular address given on the address input lines;
read/write lines for reading/writing one or more words of a row selected by the particular address; and wherein erasing a row having the effect, that all cells of said row are set to a specific value.

By providing additional address mask input lines each address mask input line being assigned to an address input line, wherein an address mask input line in activated state has the effect of ignoring the assigned address input line. Therefore any write operation can be carried out in parallel for said ignored address bit or in other words: with one write operation into a plurality of rows a specific value (test pattern) can be written. This parallelism is used to increase the efficiency for testing a memory device, since each test comprises writing a particular pattern respectively word or words into the memory.

For testing a non-volatile memory device there are two principals available for writing/reading a test pattern:
(1) Either with the following three erase/write operations:
1.1 erasing the memory matrix wherein the erasing has the effect of putting all cells to an initial value;
1.2 performing write operations into odd rows or groups of odd rows with a particular pattern;
1.3 performing write operations into even rows or groups of even rows with the inverse of the particular pattern.

These three erase/write operations are controlled by drivers for the rows and the lines of the address decoder. It has to be noted, that for these three erase/write operations, only half of the memory matrix can be tested. For that a failure of two neighboring cells can be detectable whereas a failure between two non-neighboring cells cannot be detectable.

(2) Alternatively the two erase/write operations can be performed:
2.1 erasing the memory matrix wherein the erasing has the effect of putting all cells to an initial value;
2.2 performing write operations into only even or odd rows or groups of even or odd rows with a particular pattern.

These two operations allow detecting if there are shorts between two neighboring cells. In this case the corresponding columns are also short-circuited. In such a case the high voltage source is not capable to provide the necessary voltage for erasing the cells respectively setting the cells to a defined initial value.

The above principals can be applied for all bits of the address lines as input of an address decoder attached to a memory matrix and allow a more efficient testing of a memory device.

BRIEF DESCRIPTION OF THE DRAWINGS

The working principle of the invention will now be described more in detail with reference to the accompanying drawings wherein.

DETAILED DESCRIPTION OF THE INVENTION

Figure 2A:
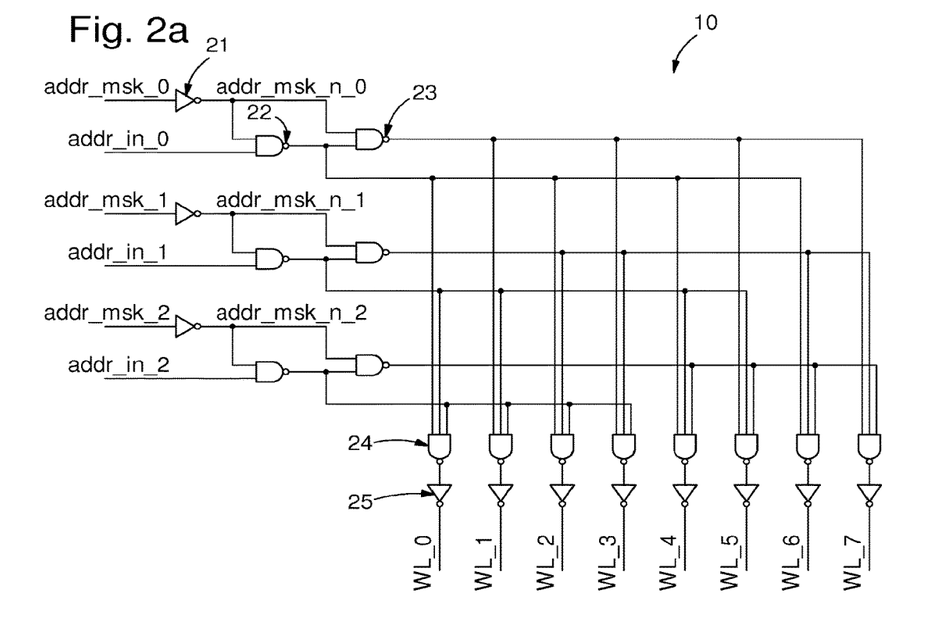
FIGS. 2a and 2b show two embodiments of a modified structure of an address decoder circuit allowing to speed up the address decoder test and the memory test according to the invention.
Figure 2B:
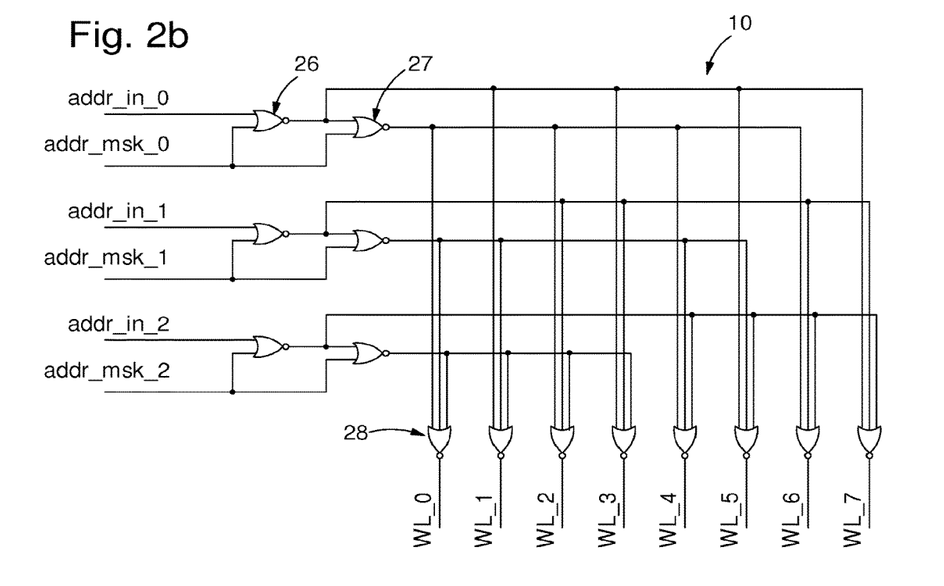

As shown in FIGS. 2a and 2b of the present invention, the circuit according to the state of the art as depicted in FIGS. 1a and 1b is modified by adding a bus of addr_msk signals. To each input address line addr_in_0, addr_in_1, addr_in_2, respective address mask input lines addr_msk_0, addr_msk_1, addr_msk_2 are assigned.

In more details for the first embodiment of the address decoder 10 shown in FIG. 2a, there are three first inverters 21 to receive respectively the address mask input lines addr_msk_0, addr_msk_1, addr_msk_2 and to provide three inverted address mask inputs addr_msk_n_0, addr_msk_n_1, addr_msk_n_2. Three first NAND gates 22 respectively receive the inverted address mask inputs addr_msk_n_0, addr_msk_n_1, addr_msk_n_2 and three corresponding address inputs addr_in_0, addr_in_1, addr_in_2 for an address bus of 3 bits. Three second NAND gates 23 respectively receive the outputs of the first NAND gates 22 and the inverted address mask inputs addr_msk_n_0, addr_msk_n_1, addr_msk_n_2. The outputs of the first NAND gates 22 and the outputs of the second NAND gates 23 are used and combined per three through third NAND gates 24 followed by three second inverters 25 for selecting particular rows WL_0, WL_1, WL_2, WL_3, WL_4, WL_5, WL_6, WL_7 of the memory array.

For the second embodiment in FIG. 2b, there are not the first inverters, and the first NAND gates are replaced by three first NOR gates 26. The second NAND gates are replaced by three second NOR gates 27. Finally the third NAND gates and second inverters are replaced by only three third NOR gates 28 for selecting particular rows WL_0, WL_1, WL_2, WL_3, WL_4, WL_5, WL_6, WL_7 of the memory array.

Each bit of this bus of the addr_msk_x signals allows to ignore one bit of the address. In other words, an activated state of an address mask input line has the effect of ignoring the assigned input address line. As above-mentioned the example of the implementation of such a circuit with the additional addr_msk_x lines is depicted in FIGS. 2a and 2b for example for a memory of 8 rows and 8 columns.

This modified structure of the address decoder allows speeding up the address decoder test and the memory matrix or array test as explained below. There is a supplementary input bus with the same width as the width of the address inputs. This bus is called <<addr_msk bus>>, in the following denoted by addr_msk bus only.

The addr_msk bus comprises in the example according to FIGS. 2a and 2b the lines addr-msk_0, addr_msk_1 and addr_msk_2 for a bus of three bits in this case.

The addr_msk bus is used for a test of the address decoder and the memory array by the following way. The electronic memory device with the address decoder can be tested by a separate testing of each bit of the address. The memory can be a non-volatile memory. The test is done by several steps, in which each step checks the decoding of one bit of the row address.

It is to be noted that the number of first inverters, first NAND gates, and second NAND gates of the first embodiment in FIG. 2a depends of the number of bits of address bus. It is the same case for the second embodiment in FIG. 2b with the first NOR gates and second NOR gates.

Figure 3:
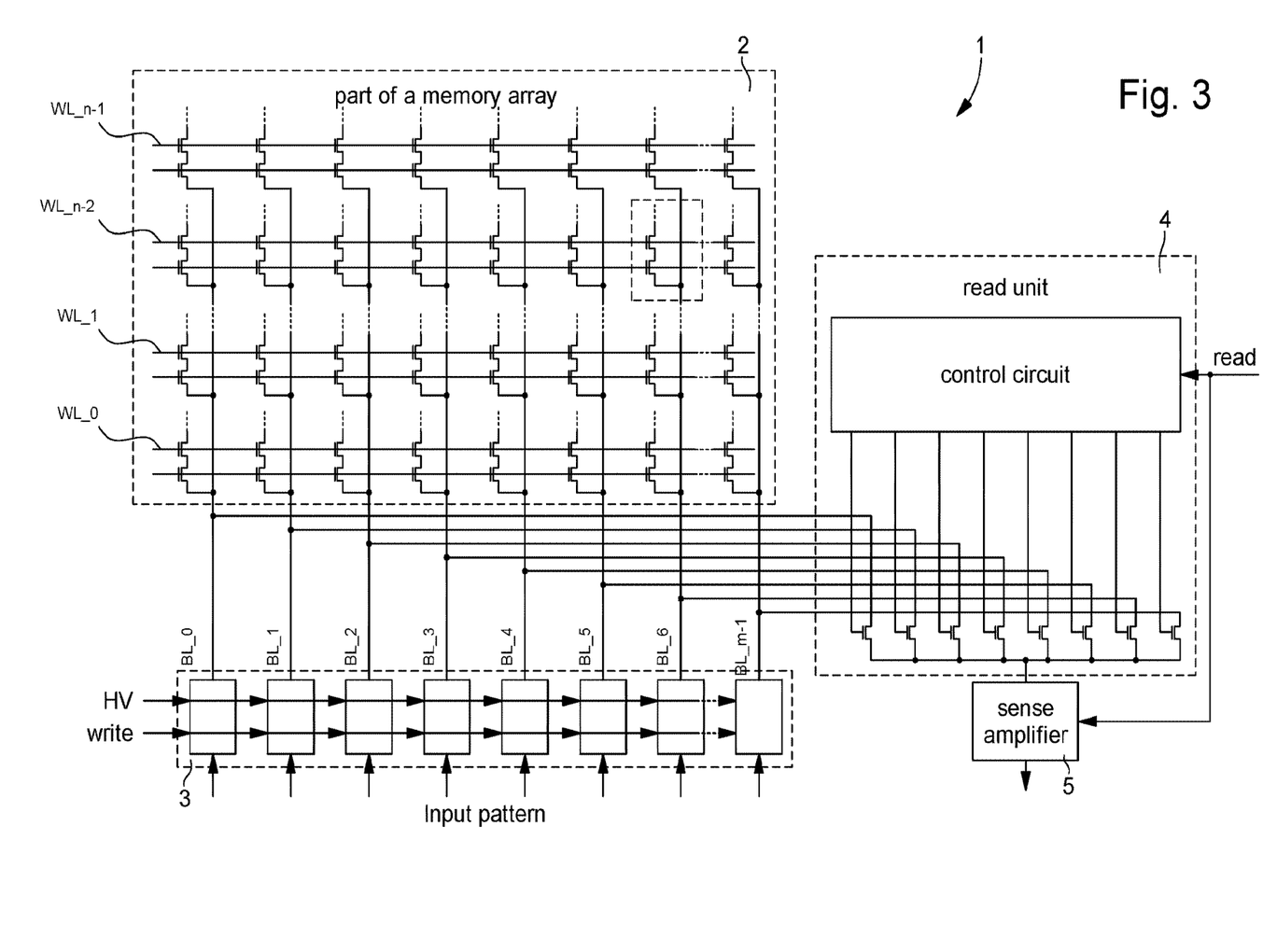
FIG. 3 shows a part of memory matrix with the allocated lines from address decoder circuit according to FIGS. 2a and 2b, an allocated column driver unit and an allocated read unit.

FIG. 3 shows an electronic memory device 1 with a memory matrix or array 2 organized in rows and columns. The memory matrix 2 has memory cells, wherein the cells of one row are forming one or more memory words. In this example, one word of m bits can be programmed or written on each row of n rows referenced WL_0, WL_1, WL_n−2, WL_n−1 by an adequate input pattern through a column driver unit 3. An address decoder according to FIGS. 2a and 2b, that is not shown in FIG. 3, is connected to the memory matrix for selecting a particular row according to the address in case, where the addr_msk bus is disabled. In case where at least one line of the addr_msk bus is activated, a plurality of rows of the memory matrix is selected. The column driver unit 3 allows either erasing the content of selected row(s) or writing one or more words into selected row(s) of the memory matrix. Through the column driver unit 3, m column signals BL_0, BL_1, BL_2, BL_3, BL_4, BL_5, BL_6, BL_m−1 are provided for erasing or writing the selected rows by the adequate input pattern.

The erasing occurs with a so called High Voltage HV obtained by a conventional charge pump not shown and with a control signal "write" for the column driver unit 3. After an erase operation all selected rows have a defined value, usually 11 . . . 11. It has to be noted, the width m of a row respectively the number m of columns is independent from the number n of rows. Finally a read unit 4 is also connected to the memory matrix 2 for reading a particular row or a part of a row selected by a particular address on the address bus by passing a conventional sense amplifier 5. For that a read signal controls a control circuit of the read unit 4 and the sense amplifier 5. A read operation however does not make sense, for a plurality of rows selected by a particular address with an activated addr_msk bus.

The method for testing a memory matrix is explained below for an address bus with n=3 respectively with 8 rows and a width of a word of 8, respectively the number of columns m=8. The width of a row is completely independent from the number of rows. In the test method, there are two variants explained hereafter.

Step

The write and read operation of a checkerboard pattern allows to test bit 0 of the address as well as the shorts between the odd/even word lines. Said step 1 comprises in a first variant the following sub-steps:

1.1 Erase the memory, i.e. all the cells of the memory matrix by putting addr_msk to 111 (=activated for all address mask lines) and performing an erase operation with HV, see FIG. 3. 111 stands in this order for:
addr_msk_2=1
addr_msk_1=1
addr_msk_0=1.
1.2 Set addr_msk to 110 to ignore all bits of the address except the LSB (assigned address input line), wherein 110 stands in this order for:
addr_msk_2=1
addr_msk_1=1
addr_msk_0=0.
1.3 Set addr_in to xx0 to select even lines/rows.
1.4 Perform the write operation by the column driver unit with the pattern $d_{in}$=01010 . . . 01. In the nomenclature introduced above the pattern $d_{in}$ stands in principle for a word.
1.5 Set addr_in to xx1 to select odd rows.
1.6 Perform the write operation with the pattern $d_{in}$= 10101 . . . 10.
1.7 Read and check/compare the checkerboard pattern. It should look like depicted in the following table, in which the checkerboard pattern is for a test of bit 0 of the address and eventually shorts in the memory array.

| row\column | 7 | 6 | 5 | 4 | 3 | 2 | 1 | 0 |
|---|---|---|---|---|---|---|---|---|
| 0 | 0 | 1 | 0 | 1 | 0 | 1 | 0 | 1 |
| 1 | 1 | 0 | 1 | 0 | 1 | 0 | 1 | 0 |
| 2 | 0 | 1 | 0 | 1 | 0 | 1 | 0 | 1 |
| 3 | 1 | 0 | 1 | 0 | 1 | 0 | 1 | 0 |
| 4 | 0 | 1 | 0 | 1 | 0 | 1 | 0 | 1 |
| 5 | 1 | 0 | 1 | 0 | 1 | 0 | 1 | 0 |
| 6 | 0 | 1 | 0 | 1 | 0 | 1 | 0 | 1 |
| 7 | 1 | 0 | 1 | 0 | 1 | 0 | 1 | 0 |

Reading the checkerboard pattern means a reading of the whole memory matrix row by row according to the above-mentioned table. In this example 8 read operations have to be performed. These 8 reading operations respectively reading the whole memory matrix will be denoted in the following shortly by "read matrix".

For a second variant of the test method, the steps 1.5 and 1.6 are not necessary when taking into account the initial value of 1 of each cell after an erase operation of the non-volatile memory device.

It has to be noted, that erasing the memory has the effect, that the content of all cells are set for example to 1 in this particular case.

Step 2

The write and read operation of a checkerboard pattern allows to test bit 1 of the address as well as the shorts between groups of odd/even word lines. Said step 2 comprises in the first variant the following sub-steps:

2.1 Erase the memory, i.e. all the cells of the memory matrix by putting addr_msk to 111 and performing an erase operation with HV, as shown in FIG. 3.
2.2 Set addr_msk to 101 to ignore all bits of the address except bit 1.
2.3 Set addr_in to x0x.
2.4 Perform the write operation with the pattern $d_{in}$=00110011.
2.5 Set addr_msk in to x1x.
2.6 Perform the write operation with the pattern $d_{in}$=11001100.
2.7 Read and check/compare the memory content. It should look like depicted in the following table, in which the checkerboard pattern is for a test of bit 1 of the address and also shorts in the memory array at step 2.

| row | column | | | | | | | |
|---|---|---|---|---|---|---|---|---|
| | 7 | 6 | 5 | 4 | 3 | 2 | 1 | 0 |
| 0 | 0 | 0 | 1 | 1 | 0 | 0 | 1 | 1 |
| 1 | 0 | 0 | 1 | 1 | 0 | 0 | 1 | 1 |
| 2 | 1 | 1 | 0 | 0 | 1 | 1 | 0 | 0 |
| 3 | 1 | 1 | 0 | 0 | 1 | 1 | 0 | 0 |

| row | \multicolumn{8}{c}{column} |
| --- | --- | --- | --- | --- | --- | --- | --- | --- |
|     | 7 | 6 | 5 | 4 | 3 | 2 | 1 | 0 |
| 4   | 0 | 0 | 1 | 1 | 0 | 0 | 1 | 1 |
| 5   | 0 | 0 | 1 | 1 | 0 | 0 | 1 | 1 |
| 6   | 1 | 1 | 0 | 0 | 1 | 1 | 0 | 0 |
| 7   | 1 | 1 | 0 | 0 | 1 | 1 | 0 | 0 |

Step 2 can be performed alternatively as follows in the second variant of the test method in order to save (respectively in order to omit) one write operation:

2'.1 Erase the memory, i.e. all the cells of the memory matrix by putting addr_msk to 111, and performing an erase operation with HV, as shown in FIG. 3.
2'.2 Set addr_msk to 101 to ignore all bits of the address except bit 1.
2'.3 Set address to x0x.
2'.4 Perform the write operation with $d_{in}$=00110011.
2.7 Read and check/compare the memory content. It should look like in the following table, in which only one row and column needs to be read. So the memory content would look like as follows, in which the checkerboard pattern is for a test of bit 1 of the address and also shorts in the memory array at an alternative step 2.

| row\column | 7 | 6 | 5 | 4 | 3 | 2 | 1 | 0 |
| --- | --- | --- | --- | --- | --- | --- | --- | --- |
| 0 | 0 | 0 | 1 | 1 | 0 | 0 | 1 | 1 |
| 1 | 0 | 0 | 1 | 1 | 0 | 0 | 1 | 1 |
| 2 | 1 | 1 | 1 | 1 | 1 | 1 | 1 | 1 |
| 3 | 1 | 1 | 1 | 1 | 1 | 1 | 1 | 1 |
| 4 | 0 | 0 | 1 | 1 | 0 | 0 | 1 | 1 |
| 5 | 0 | 0 | 1 | 1 | 0 | 0 | 1 | 1 |
| 6 | 1 | 1 | 1 | 1 | 1 | 1 | 1 | 1 |
| 7 | 1 | 1 | 1 | 1 | 1 | 1 | 1 | 1 |

Step 3

The write and read operation of a checkerboard pattern allows to test bit 2 of the address as well as the shorts between groups of odd/even word lines. Said step 3 comprises in the first variant the following sub-steps:

3.1 Erase the memory, i.e. all the cells of the memory matrix by putting addr_msk to 111, and performing an erase operation with HV, as shown in FIG. 3.
3.2 Set addr_msk to 011 to ignore all the bits of the address except the bit 2.
3.3 Set address to 0xx.
3.4 Perform the write operation with the pattern $d_{in}$=00001111.
3.5 Set addr_in to 1xx.
3.6 Perform the write operation with the pattern $d_{in}$=11110000.
3.7 Read and check/compare the memory content. It should look as depicted in the following table, in which the checkerboard pattern of step 3 is for a test of bit 2 of the address and also shorts in the memory array.

| row | \multicolumn{8}{c}{column} |
| --- | --- | --- | --- | --- | --- | --- | --- | --- |
|     | 7 | 6 | 5 | 4 | 3 | 2 | 1 | 0 |
| 0 | 0 | 0 | 0 | 0 | 1 | 1 | 1 | 1 |
| 1 | 0 | 0 | 0 | 0 | 1 | 1 | 1 | 1 |
| 2 | 0 | 0 | 0 | 0 | 1 | 1 | 1 | 1 |
| 3 | 0 | 0 | 0 | 0 | 1 | 1 | 1 | 1 |
| 4 | 1 | 1 | 1 | 1 | 0 | 0 | 0 | 0 |
| 5 | 1 | 1 | 1 | 1 | 0 | 0 | 0 | 0 |
| 6 | 1 | 1 | 1 | 1 | 0 | 0 | 0 | 0 |
| 7 | 1 | 1 | 1 | 1 | 0 | 0 | 0 | 0 |

Again also step 3 can be performed alternatively as follows in the second variant of the test method in order to save (respectively in order to omit) one write operation:

3'.1 Erase the memory, i.e. all the cells of the memory matrix by putting addr_msk to b111 and performing an erase operation with HV, as shown in FIG. 3.
3'.2 Set addr_msk to 011 to ignore all bits of the address except bit 2.
3'.3 Set address to 0xx.
3'.4 Perform the write operation with the pattern $d_{in}$=00001111.
3'.5 Read and check/compare the memory content. It should look as depicted in the following table, in which only one row and column needs to be read. So the memory content would look like as follows, in which the checkerboard pattern is for a test of bit 2 of the address and also shorts in the memory array at an alternative step 3.

| row\column | 7 | 6 | 5 | 4 | 3 | 2 | 1 | 0 |
| --- | --- | --- | --- | --- | --- | --- | --- | --- |
| 0 | 0 | 0 | 0 | 0 | 1 | 1 | 1 | 1 |
| 1 | 0 | 0 | 0 | 0 | 1 | 1 | 1 | 1 |
| 2 | 0 | 0 | 0 | 0 | 1 | 1 | 1 | 1 |
| 3 | 0 | 0 | 0 | 0 | 1 | 1 | 1 | 1 |
| 4 | 1 | 1 | 1 | 1 | 1 | 1 | 1 | 1 |
| 5 | 1 | 1 | 1 | 1 | 1 | 1 | 1 | 1 |
| 6 | 1 | 1 | 1 | 1 | 1 | 1 | 1 | 1 |
| 7 | 1 | 1 | 1 | 1 | 1 | 1 | 1 | 1 |

These patterns also fully check the bit line decoding. This step can be combined with the simultaneous write and read for the test of the bit line decoding especially for memories having a larger number of columns than the number of the rows. It has to be noted in the first variant of the test method, that in the step <<0.6>> an inverse pattern $d_{in}$ is used, that is a pattern inverse to the pattern in the step <<0.4>>.

The test time reduction depends on the memory size. It is most efficient for large memory blocks. The time reduction is shown in the next table for a memory size of $2^3$=8 words as explained above. Not considered is the time needed for test of the bit 0, since it is done by the checkerboard patterns which is anyway used for test of the memory cells.

For a Memory with $2^3$=8 Rows Respectively 3 Address Lines

|  | Standard | Accelerated with CKB | Accelerated with odd only (Alternative pattern) |
| --- | --- | --- | --- |
| Number of erase operations | 1 | 2 | 2 |
| Number of write operations | 8 | 4 | 2 |
| Total HV operations (erase + write) | 9 | 6 | 4 |

-continued

|  | Standard | Accelerated with CKB | Accelerated with odd only (Alternative pattern) |
|---|---|---|---|
| Total HV operations [%] | 100 | 66 | 44 |
| Read matrix | 1 | 3 | 3 |

In the previous table, it is mentioned the test time reduction. For that, it is indicated the number of operations according to the example given above with steps 2 and 3.

For a Memory with $2^n$ Rows Respectively n Address Lines

|  | standard | accelerated with CKB | accelerated with odd only (Alternative pattern) |
|---|---|---|---|
| Number of erase operations HV | 1 | (n − 1) | (n − 1) |
| Number of write operations | $2^n$ | 2 · (n − 1) | (n − 1) |
| Total HV operations (erase + write) | $2^n + 1$ | 3 · (n − 1) | 2 · (n − 1) |
| Total HV operations [%] | 100 | 3 · (n − 1)/($2^n$ + 1) | 2 · (n − 1)/($2^n$ + 1)) |
| Read matrix | 1 | (n − 1) | (n − 1) |

In the previous table, it is indicated the number of operations for a memory with $2^n$ rows, respectively n address lines and the corresponding steps 2 to 3.

The reduction of operations in relation to the standard testing is given in the following table, for some typical values of n respectively for a memory size of $2^n$ words. Said table shows the numerical reduction of operations in relation to the standard testing.

| n | $2^n$ | Total operations including HV accelerated with CKB [%] | Total operations including HV accelerated with odd only [%] |
|---|---|---|---|
| 3 | 8 | 66.66 | 44.44 |
| 4 | 16 | 52.94 | 35.29 |
| 8 | 64 | 8.17 | 5.45 |
| 10 | 1024 | 2.63 | 1.76 |
| 12 | 4096 | 0.81 | 0.54 |

The electronic memory device and the test method disclosed herein are not limited to the purpose as given above. The electronic memory device described as above can be also used for other purposes like:

Simultaneous Write of Two Rows

The same content can be written into two (or even more) rows by one write operation to improve the reliability of the data. The two worst must differ by one bit in address only.

Dynamically Scalable Erase Block

The erase operation can be performed on different memory blocks by using the function described above. The only limitation is the size of the block—it must be a power of two. This feature a scalable erase block is particular useful in applications, where an updated/patch of a software portion has to be carried out.

Redundancy Enabling on the Fly

The redundancy can be simply enabled by ignoring some address bits and it can be even different for different memory words—the cycling requirements and gate disturb requirements can be generally different for each word of the memory. Even more than two cells in parallel can be used if needed.

The redundancy means two (or even more) memory cells in parallel to store one bit. The bit can be correctly read even if one of the memory cells doesn't work correctly.

Logical Operation Between Different Words

A logical OR operation can be performed with bits on different words by ignoring of some bits of the address during the reading.

From the description that has just been given, multiple variants of the test method of the electronic memory device, and the electronic memory device can be devised by those skilled in the art without departing from the scope of the invention defined by the claims.

What is claimed is:

1. A method for testing an electronic memory device, the electronic memory device including:
   a memory matrix organized in rows and columns, the memory matrix having memory cells, wherein the cells of one row are forming one or more memory words;
   an address decoder with address input lines for selecting a row according to a particular address given on the address input lines, the address defined by a fixed number of bits; and
   read/write lines for reading/writing at least cine word of a row selected by the particular address,
   the address decoder including additional address mask input lines, each address mask input line assigned to a respective address input line, herein an address mask input line in an activated state has an effect of ignoring the assigned address input line;
   the method comprising:
   testing a particular bit of the address other than a lowest bit of the address, the testing the particular bit including:
   A) erasing the memory matrix by putting all address mask input lines into the activated state;
   B) putting all the address mask input lines in the activated state except the particular bit of the assigned address mask input line to ignore all bits of the address except the particular bit to be tested;
   C) setting the particular bit of the address to 0;
   D) performing a write operation with a dedicated word that is the same for different selected lines;
   E) reading at least a first row 0 and a highest column;
   F) comparing read values of the first row 0 and the highest column with a pattern defined by the written dedicated word and an initial value; and
   G) in case the comparing in step F) discloses a difference, mark the electronic memory device as defective.

2. The method according to claim 1, wherein each step A) to G) is carried out for all successive particular bits of the address.

3. The method according to claim 1, wherein step E) and F) are performed by reading of the memory matrix row by row.

4. The method according to claim 1, further comprising before step E):
   D') setting the particular bit of the address to 1;
   D") performing a write operation with an inverse of the dedicated word for other selected lines.

5. The method according to claim 1, wherein the initial value after an erase operation is 1.

6. An electronic memory device comprising:
a memory matrix organized in rows and columns, the memory matrix having memory cells, wherein the cells of one row are forming one or more memory words;
an address decoder with address input lines for selecting a row according to a particular address given on the address input lines; and
read/write lines for reading/writing at least one word of a row selected by the particular address, wherein
erasing a row of the memory matrix has an effect that all cells of said row are set to a defined value,
the address decoder includes additional address mask input lines, each address mask input line being assigned to a respective address input line, wherein an address mask input line in an activated state has an effect of ignoring the assigned address input line for selecting at least one row, and
the address decoder is configured so that, when a particular bit of the address other than a lowest bit of the address is tested, the address mask input lines are put into the activated state to erase the memory matrix, and all the address mask input lines are put in the activated state except the particular bit of the assigned address mask input line to ignore all bits of the address except the particular bit to be tested.

7. The electronic memory device according to claim 6, wherein the memory matrix is a non-volatile memory matrix.

8. The electronic memory device according to claim 6, wherein a plurality of address mask input lines in the activated state are having an effect of ignoring the assigned address input lines for selecting rows.

9. The electronic memory device according to claim 6, wherein a column driver unit is connected with the memory matrix for either erasing content of selected rows or writing a word into the selected rows.

10. The electronic memory device according to claim 6, wherein the address decoder includes first inverters to receive respectively the address mask input lines and to provide inverted address mask inputs, first NAND gates respectively receiving the inverted address mask inputs and corresponding row address input lines, and second NAND gates respectively receiving outputs of the first NAND gates and the inverted address mask inputs, and wherein the outputs of the first NAND gates and outputs of the second NAND gates are used and combined per three through third NAND gates followed by second inverters for selecting particular rows of the memory matrix.

11. The electronic memory device according to claim 6, wherein the address decoder includes first NOR gates to receive row address input lines and corresponding assigned address mask input lines, and second NOR gates receiving outputs of the first NOR gates and address mask input lines, and wherein the outputs of first NOR gates and outputs of the second NOR gates are used and combined per three through third NOR gates for selecting particular rows of the memory matrix.

* * * * *

UNITED STATES PATENT AND TRADEMARK OFFICE
CERTIFICATE OF CORRECTION

PATENT NO. : 9,881,692 B2
APPLICATION NO. : 14/930785
DATED : January 30, 2018
INVENTOR(S) : Lubomir Plavec et al.

It is certified that error appears in the above-identified patent and that said Letters Patent is hereby corrected as shown below:

On the Title Page

Item (72):
Please correct inventor's country of address as follows:
"Miloslav Kubar, Prague (CH)" to --Miloslav Kubar, Prague (CZ)--.

In the Claims

Column 10, Line 30:
Please replace the word "cine" with --one--.

Column 10, Line 34:
Please replace the word "herein" with --wherein--.

Column 10, Line 39:
Please replace "the testing the particular" with --the testing of the particular--.

Signed and Sealed this
Eleventh Day of June, 2019

Andrei Iancu
*Director of the United States Patent and Trademark Office*